US008431959B2

(12) United States Patent
Davis et al.

(10) Patent No.: US 8,431,959 B2
(45) Date of Patent: Apr. 30, 2013

(54) METHOD OF FORMING AN ESD PROTECTION DEVICE AND STRUCTURE THEREFOR

(75) Inventors: T. Jordan Davis, Phoenix, AZ (US); Ali Salih, Mesa, AZ (US)

(73) Assignee: Semiconductor Components Industries, LLC, Phoenix, AZ (US)

( * ) Notice: Subject to any disclaimer, the term of this patent is extended or adjusted under 35 U.S.C. 154(b) by 241 days.

(21) Appl. No.: 12/907,633

(22) Filed: Oct. 19, 2010

(65) Prior Publication Data
US 2012/0091504 A1 Apr. 19, 2012

(51) Int. Cl.
*H01L 29/66* (2006.01)

(52) U.S. Cl.
USPC .... 257/173; 257/328; 257/546; 257/E29.335; 257/E21.356; 438/140; 438/237

(58) Field of Classification Search ............... 438/237, 438/140, 983, 380; 257/E21.355, E21.356, 257/E29.335, E27.051
See application file for complete search history.

(56) References Cited

U.S. PATENT DOCUMENTS

| | | | |
|---|---|---|---|
| 7,538,395 B2 | 5/2009 | Keena et al. | |
| 7,579,632 B2 | 8/2009 | Salih et al. | |
| 2009/0079022 A1* | 3/2009 | Keena et al. | ........... 257/494 |
| 2009/0302424 A1 | 12/2009 | Duskin et al. | |
| 2010/0090306 A1 | 4/2010 | Salih et al. | |

OTHER PUBLICATIONS

M. Schmitt et al, "A Comparison of Electron, Proton and helium Ion Irradiation for the Optimization of the CoolMOS (TM) Body Diode", Infineon Technologies AG, Copyright 2002 IEEE, 0-7803-7318-9/02, pp. 229-232.

* cited by examiner

*Primary Examiner* — Michelle Mandala
*Assistant Examiner* — Shaka White
(74) *Attorney, Agent, or Firm* — Robert F. Hightower

(57) ABSTRACT

In one embodiment, a bi-directional ESD device is formed to have a third harmonic at frequencies no less than about one gigahertz wherein the third harmonic has a magnitude that is no greater than about minus thirty five dBm.

21 Claims, 6 Drawing Sheets

METHOD OF FORMING AN ESD PROTECTION DEVICE AND STRUCTURE THEREFOR

BACKGROUND OF THE INVENTION

The present invention relates, in general, to electronics, and more particularly, to semiconductors, structures thereof, and methods of forming semiconductor devices.

In the past, electronics equipment had been susceptible to electro-static discharge (ESD) from various sources and especially from people that worked in the vicinity of or that touched the equipment. In some cases, ESD protection devices were attached to places of the equipment where such as ESD event may occur. In many applications, the ESD protection devices were attached to signal lines that provided input or an output signals to the electronic equipment. Typically, the application required that the ESD protection device had to have a low capacitance in order to prevent interfering with the signal or prevent forming a large load for devices that maybe driving the signal line In applications for which the signal was at a high frequency, such as eight hundred MHz or greater, it was important that the ESD protection device did not produce inter-modulation distortions (distortions) at frequencies that were substantially the same as the frequency of the signal frequency or produce the distortions at multiples of the signal frequency. It was difficult to minimize the amplitude of these distortions.

Accordingly, it is desirable to have an integrated circuit ESD protection device that has a low capacitance and that has low generated distortions.

For simplicity and clarity of the illustration, elements in the figures are not necessarily to scale, and the same reference numbers in different figures denote the same elements, unless stated otherwise. Additionally, descriptions and details of well-known steps and elements are omitted for simplicity of the description. As used herein current carrying electrode means an element of a device that carries current through the device such as a source or a drain of an MOS transistor or an emitter or a collector of a bipolar transistor or a cathode or anode of a diode, and a control electrode means an element of the device that controls current through the device such as a gate of an MOS transistor or a base of a bipolar transistor. Although the devices are explained herein as certain N-channel or P-Channel devices, or certain N-type or P-type doped regions, a person of ordinary skill in the art will appreciate that complementary devices are also possible in accordance with the present invention. It will be appreciated by those skilled in the art that the words during, while, and when as used herein relating to circuit operation are not exact terms that mean an action takes place instantly upon an initiating action but that there may be some small but reasonable delay, such as various propagation delays, between the reaction that is initiated by the initial action. Additionally, the term while means that a certain action occurs at least within some portion of a duration of the initiating action. The use of the word approximately or substantially means that a value of an element has a parameter that is expected to be close to a stated value or position. However, as is well known in the art there are always minor variances that prevent the values or positions from being exactly as stated. It is well established in the art that variances of up to at least ten per cent (10%) (and up to twenty per cent (20%) for semiconductor doping concentrations) are reasonable variances from the ideal goal of exactly as described. The terms first, second, third and the like in the claims or/and in the Detailed Description of the Drawings, as used in a portion of a name of an element are used for distinguishing between similar elements and not necessarily for describing a sequence, either temporally, spatially, in ranking or in any other manner. It is to be understood that the terms so used are interchangeable under appropriate circumstances and that the embodiments described herein are capable of operation in other sequences than described or illustrated herein. For clarity of the drawings, doped regions of device structures are illustrated as having generally straight line edges and precise angular corners. However, those skilled in the art understand that due to the diffusion and activation of dopants the edges of doped regions generally may not be straight lines and the corners may not be precise angles.

DETAILED DESCRIPTION OF THE DRAWINGS

Figure 1:
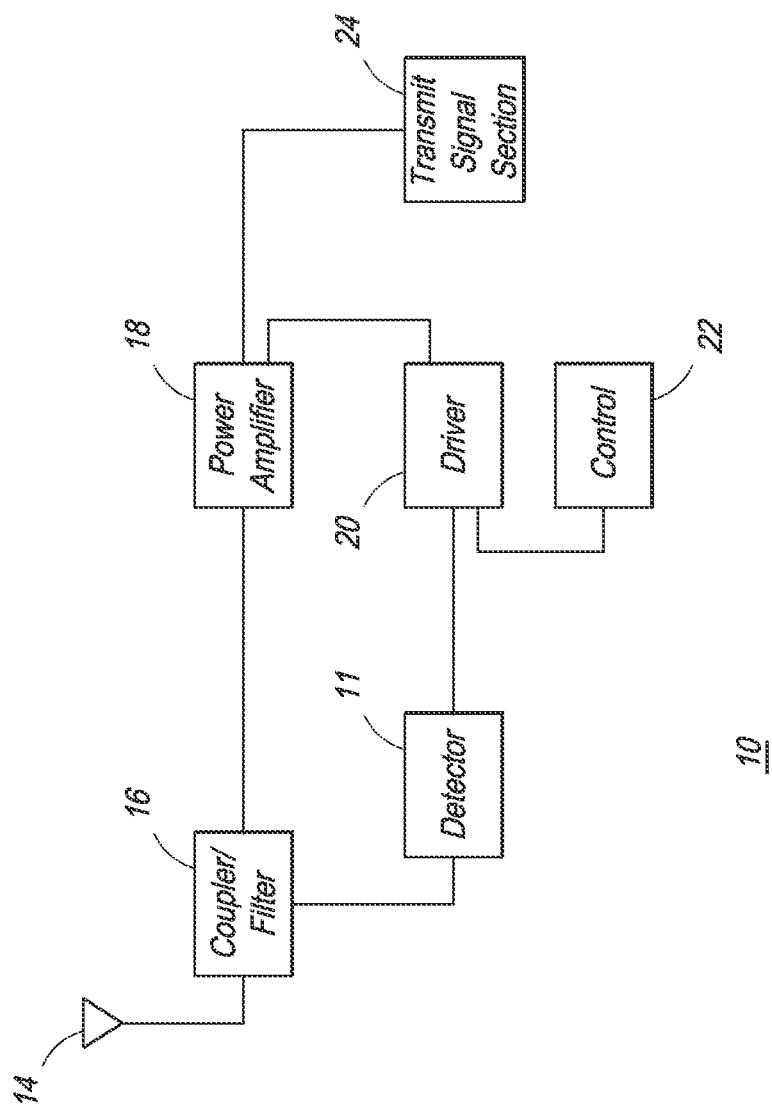
FIG. 1 schematically illustrates a block diagram example of a radiofrequency (RF) transmitter and receiver system that may include an ESD device in accordance with the present invention.

FIG. 1 schematically illustrates a block diagram example of a radiofrequency (RF) transmitter and receiver system 10. System 10 typically transmits and receives signals at frequencies that are greater than about eight hundred (800) MHz via an antenna 14. Received signals typically go through a coupler or filter 16 to a detector 11. A transmit signal section 24 generates signals that are to be transmitted and provides the signals to a power amplifier 18. A control circuit 22 generates a high-frequency carrier and provides the carrier signal to a driver 20 which drives power amplifier 18. Amplifier 18 modulates the carrier signal with the signals from transmit signal section 24. In some embodiments, system 10 may be a portion of a cellular telephone. The illustrated embodiment of system 10 is merely an example, thus, other system embodiments may have a different configuration.

When people handle the cellular telephone it is possible that the person may cause an electrode-static discharge to antenna 14 which can be coupled to the input of detector 11 or the output of amplifier 18, or to other system elements. Such an ESD event could damage detector 11 or amplifier 18 or other circuits in system 10.

In order to minimize damage to detector 11 or amplifier 18 or to other system elements, it is desirable to have an ESD protection device connected to the input of detector 11, or to the output of amplifier 18, or to other places within system 10 that can provide protection from the ESD event. Because the signals received by system 10 have a low amplitude, the ESD protection device should have a low capacitance so that the ESD device does not affect the signal quality. Because of the high frequencies and low signal levels received by system 10, an ESD protection device should also minimize the amplitude of any distortions generated by the ESD device that may be either at or near the center frequency of the received signals or at multiples of the center frequency.

Figure 2:
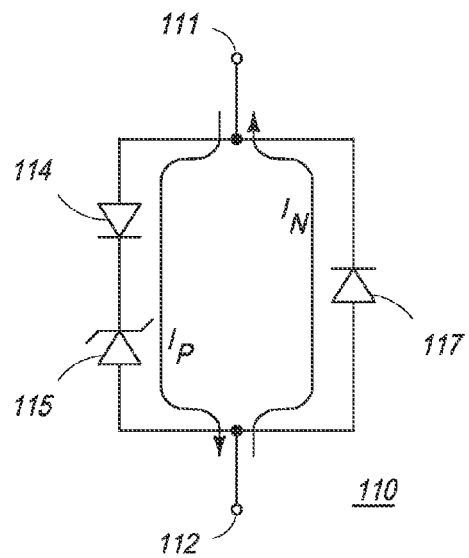
FIG. 2 schematically illustrates an embodiment of a bi-directional ESD device in accordance with the present invention.

FIG. 2 schematically illustrates one embodiment of a bi-directional ESD device 110 that has a low capacitance and that minimizes distortions of signals having frequencies that are greater than about 800 MHz and particularly at frequencies that are approximately one gigahertz (1 GHz) and greater. Device 110 includes a zener diode 115 and a P-N diode 114 that are coupled to conduct current in series through diodes 114 and 115. Device 110 also includes another P-N diode 117 that is connected in parallel with the series combination of diodes 114 and 115. In the preferred embodiment, device 110 has a first terminal 111 and a second terminal 112. An anode of diodes 115 and 117 are connected to terminal 112, and a cathode of diode 117 is connected to terminal 111. A cathode of diodes 114 and 115 are connected together and an anode of diode 114 is connected to terminal 111. One skilled in the art will appreciate that as a result of a positive ESD event at terminal 111, such as relative to terminal 112, a positive current $I_P$ flows in series from diode 114 to diode 115. Additionally, for this current flow, diode 117 is in parallel with the combination of diodes 114 and 115. A negative ESD event at terminal 111 results in a negative current $I_N$ that flows from terminal 112 through diode 117 to terminal 111.

Figure 3:
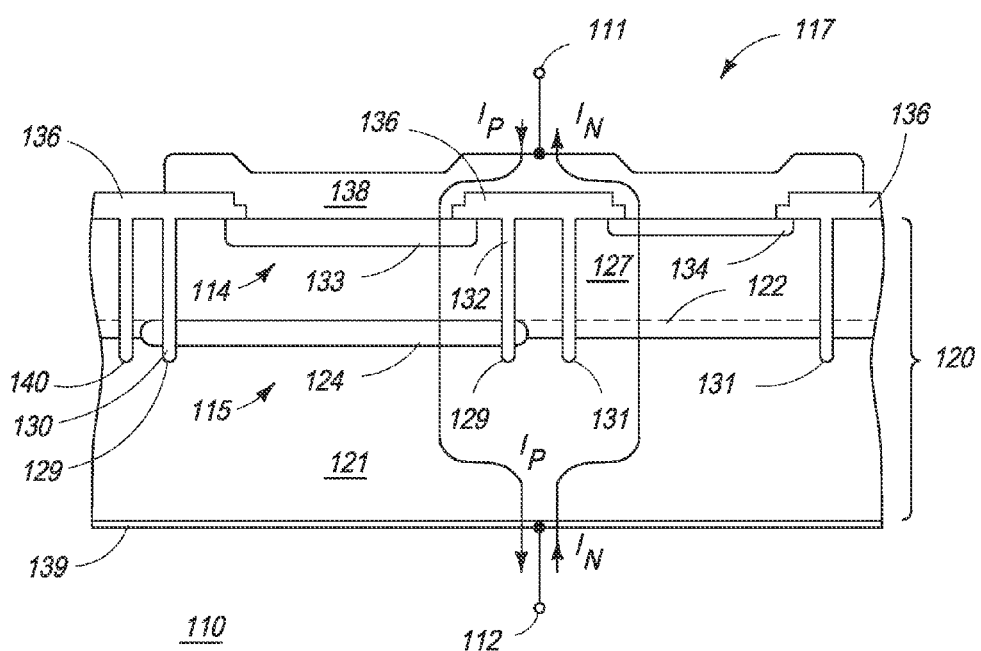
FIG. 3 illustrates a cross-sectional view of a portion of an embodiment of the ESD device of FIG. 2 in accordance with the present invention.

FIG. 3 illustrates a cross-sectional view of a portion of an embodiment of ESD device 110. Diodes 114, 115, and 117 are identified in a general manner by arrows. Diodes 114, 115, and 117 are formed on a semiconductor substrate 120. Substrate 120 may be referred to as a composite substrate that includes a bulk semiconductor substrate 121. A semiconductor layer or semiconductor region 127 may be formed on substrate 121, such as by epitaxial growth. A semiconductor region 124 is formed near the interface of the dopants that form region 127 and the dopants of substrate 121 in order to form diode 115. Diode 115 is formed by region 124 and the interface with the dopants of substrate 121.

In one embodiment, substrate 121 is formed with a P-type conductivity having a high doping concentration. Thus, substrate 121 includes a doped semiconductor material. In this embodiment, semiconductor region 124 is formed as an N-type region that also has a high doping concentration. The high doping concentrations provide a high carrier concentration for diode 115 which results in diode 115 having a very sharp transition or knee and allows very accurate control over the breakdown voltage or zener voltage of diode 115. Region 127 usually is formed to have a lower peak doping concentration than substrate 121 and region 124.

In the preferred embodiment, substrate 121 is formed with a peak doping concentration that is no less than approximately $1\times10^{19}$ atoms/cm$^3$ and preferably is between approximately $1\times10^{19}$ and $1\times10^{21}$ atoms/cm$^3$. In this preferred embodiment, semiconductor region 124 is also formed with a peak doping concentration that is no less than approximately $1\times10^{19}$ atoms/cm$^3$ and preferably is between approximately $1\times10^{19}$ and $1\times10^{21}$ atoms/cm$^3$. The peak doping concentration of region 127 preferably is at least one order of magnitude less than the doping concentration of region 124 and generally is between about $1\times10^{13}$ and $1\times10^{17}$ atoms/cm$^3$.

Region 127 and region 124 may be formed on substrate 121 by a variety of methods that are well known to those skilled in the art. For example, a thin N-type epitaxial layer, illustrated by a dashed line 122, may be formed on substrate 121 as a first portion of region 127. This first portion may be selectively doped to form region 124. Thereafter, the remainder of region 127 may be formed. Those skilled in the art understand that other methods may be used to form region 124. In another embodiment, region 124 may be implanted directly in the substrate 121 and diffused to region 124 without the aid of a thin N-type epitaxial layer, such as that illustrated by dashed line 122.

Blocking structures 129 and 131 may be formed in order to isolate the portion of region 127 where diode 114 is to be formed from the portion of region 127 where diode 117 is to be formed. Structures 129 and 131 may be formed prior to or subsequently to forming both of regions 124 and 127 or individual regions 124 and 127. Structures 129 and 131 generally are formed as isolation trenches by creating openings from a top surface of region 127, through region 127, and extending into substrate 121. Structure 129 also usually extends through region 124 a distance into substrate 121 in order to prevent conduction laterally through region 124 to region 127 and diode 117. For the trench implementation of structures 129 and 131, opening may be formed where structures 129 and 131 are to be formed. Isolation may be provided such as by forming a dielectric liner 130 along the sidewalls and bottoms of the openings and filling the remaining opening with a dielectric or with doped or undoped polysilicon. Alternately, dielectric liner 130 may be formed along the sidewalls but not bottom of the openings. Methods to form such trenches are well known to those skilled in the art. Because structure 129 extends through region 124, it reduces alignment tolerances and makes it easier to reliably produce device 110. Structure 129 preferably forms a closed polygon with a periphery that has an opening which encloses a portion of region 127, thus, structure 129 may be regarded as a multiply-connected domain. Multiply-connected domain as used herein means a domain that has hole in it. When viewed in a plan view of the surface of region 127, the periphery of structure 127 forms a polygon, such as a circle, with an opening in the middle of the circle. Similarly, structure 131 may be regarded as a multiply-connected domain. Region 124 usually is positioned such that it extends between the outside edges of structure 129 but terminates before the outside edge of structure 131. This configuration assists in using region 124 to form a continuous zener diode 115 and to ensure region 124 does not extend into the portion of region 127 underlying diode 117. As will be seen further hereinafter, other configurations of structure 129 and region 124 may be used.

Diode 114 usually includes a doped region 133 that is formed on the surface of region 127 and that has the same conductivity as substrate 121. Region 133 usually is formed to extend into region 127 and overlie region 124. Region 133 generally is positioned so that the portion of the periphery of region 133 that is at the surface of region 127 and that extends toward substrate 121 is completely surrounded by structure 129, such as by an inner periphery 132. Preferably, structure 129 is one continuous structure that is formed around region 133. In one embodiment, the peak doping concentration of region 133 is greater than the peak doping concentration of region 127 and in the preferred embodiment is approximately equal to the peak doping concentration of substrate 121. Region 133 may be formed to extend a distance no greater than about two (2) microns and preferably about one tenth to two (0.1-2) microns from the surface into region 127. The depth of region 133 may be different in other embodiments. The large differential doping concentration between region 133 and region 127 and the shallow depth of region 33 assist in providing diode 114 with a very small capacitance. This very small capacitance of diode 114 under zero bias conditions assists in forming a small zero bias capacitance for device 110. The capacitance of diode 114 at zero bias generally is less than about 0.4 pico-farads and the equivalent series capacitance of diodes 114 and 115 forms a capacitance for device 110 that is generally is less than about 0.2 pico-farads and preferably is no greater than about 0.01 pico-farads.

A doped region 134 may be formed within region 127 with the opposite conductivity to substrate 121 in order to form diode 117. In one embodiment, the peak doping concentration of region 134 may be greater than the doping concentration of region 127. In the preferred embodiment, the peak doping concentration of region 134 is approximately equal to the peak doping concentration of substrate 121. Region 134 usually is formed on the surface of region 127 and preferably extends approximately the same distance into region 127 as region 133. In this embodiment, region 134 does not overlie region 124. Region 134 may be positioned so that the periphery of region 134 at the surface of region 127 is completely surrounded by structure 131. Structure 131 preferably is one continuous structure. Because structure 131 extends through region 127, it reduces the amount of region 127 that is near region 124 thereby assisting in reducing the capacitance of diode 117. The low carrier concentration of region 127 and the shallow depth of region 134 assist in providing diode 117 with a very small capacitance. This very small capacitance of diode 117 under zero bias conditions assists in forming a small zero bias capacitance for device 110. The capacitance of diode 117 at zero bias generally is less than about 0.4 pico-farads and preferably is no greater than about 0.02 pico-farads.

Subsequently, a dielectric 136 may be formed on the surface of region 127. Openings generally are formed through dielectric 136 to expose portions of regions 133 and 134. A conductor 138 may be applied to make electrical contact to both regions 133 and 134. Conductor 138 subsequently may be connected to terminal 111. A conductor 139, such as a metal, usually is applied to a bottom surface of substrate 121 in order to form an electrode that may be connected to terminal 112, such as via a bonding connection.

Device 110 as described in the descriptions up to this point, may be formed similarly to and may have a structure that is similar to an ESD device described in U.S. Pat. No. 7,538,399 which issued on May 26, 2009, which is hereby incorporated herein by reference. Device 110 also may be formed by other methods.

Referring back to FIG. 1, device 110 may be connected to the input of detector 11 or to the output of amplifier 18 in order to protect system 10 from ESD events. Because of the operating frequency of the signals transmitted and received by system 10, it is desired that device 110 minimize the amplitude of any distortions that result from device 110 and that may affect the signals transmitted and received by system 10 including distortions that affect the signal at the operating frequency or transmit frequency of system 10 and a multiples of the operating frequency or transmit frequency. One measure of the distortions formed by device 110 in response to receiving RF energy from the transmitted or received signal is measured as the magnitude of the second ($2^{nd}$) or third (3rd) harmonic of the signal transmitted by system 10. The transmit power used for the transmit signal when measuring the magnitude of the third harmonic formed by device 110 generally is at least about ten (10) dBm and can be as high as about thirty five (35) dBm or anywhere in-between or can be 10 dBm to 40 dBm.

When a previous semiconductor type of low capacitance ESD device was in the presence of an RF signal, the previous semiconductor type could generate large amplitude distortions at multiples of the fundamental frequency of the transmitted or received RF signal. These distortions could be generated even without the ESD device receiving an ESD discharge or ESD event.

Device 110 is further formed by a method that minimizes the amplitude of the distortions, including distortions at the second ($2^{nd}$) or third multiple of fundamental frequency of the transmitted or received signal. It is believed that excess carriers may accumulate near the interface between structure 129 and the material of region 127 and/or near the interface of structure 131 and the material of region 127, and/or in the material of region 127. It is also believed that there is an electrically significant number of the excess carriers in such regions, and that the excess carriers have a sufficiently long lifetime to be able to follow the fundamental RF signal by shifting the localization of the excess charge. These movements of electrically charge carriers may produce intermodulation and distortions that can be at the same frequency as the fundamental operating frequency or at multiples thereof. It has been found that irradiating at least the portion of region 127 near structures 129 and/or 131 can reduce the magnitude of the distortion(s) generated by device 110. Therefore, one of the steps in the method of forming device 110 includes irradiating at least the portion of region 127 near structures 129 and 131. In one embodiment, the portion of region 127 that is adjacent to structures 129 and/or 133 is irradiated. The irradiation may include high energy irradiating with one of particle bombardment, an electron beam, a proton beam, a neutron beam, or gamma particles. The irradiation may be done at any stage after forming structure(s) 129 and/or 131 before or after assembling device 110 with connections, such as leads, or into a package. The irradiation preferably is performed Prior to assembling device 110 with external connections, such as with a leadframe or into a semiconductor package. The energy used for the irradiation is between approximately one (1) MeV and approximately twelve (12) MeV and the dose usually is no less than about seventy (70) Mrad. The dose can be at least two hundred fifty (250) Mrad. Seventy Mrad is approximately 700 KGy. It is believed that as a result of the irradiation, the number of excess carriers is greatly reduced, thus for a given RF signal level, the irradiation reduces the amplitude of the distortion of the RF signal generated by device 110. The technique facilitates minimizing of the spurious effect of inter-modulation and harmonic distortion caused by device 110, but at the same time improves the power added efficiency of device 110.

Figure 4:
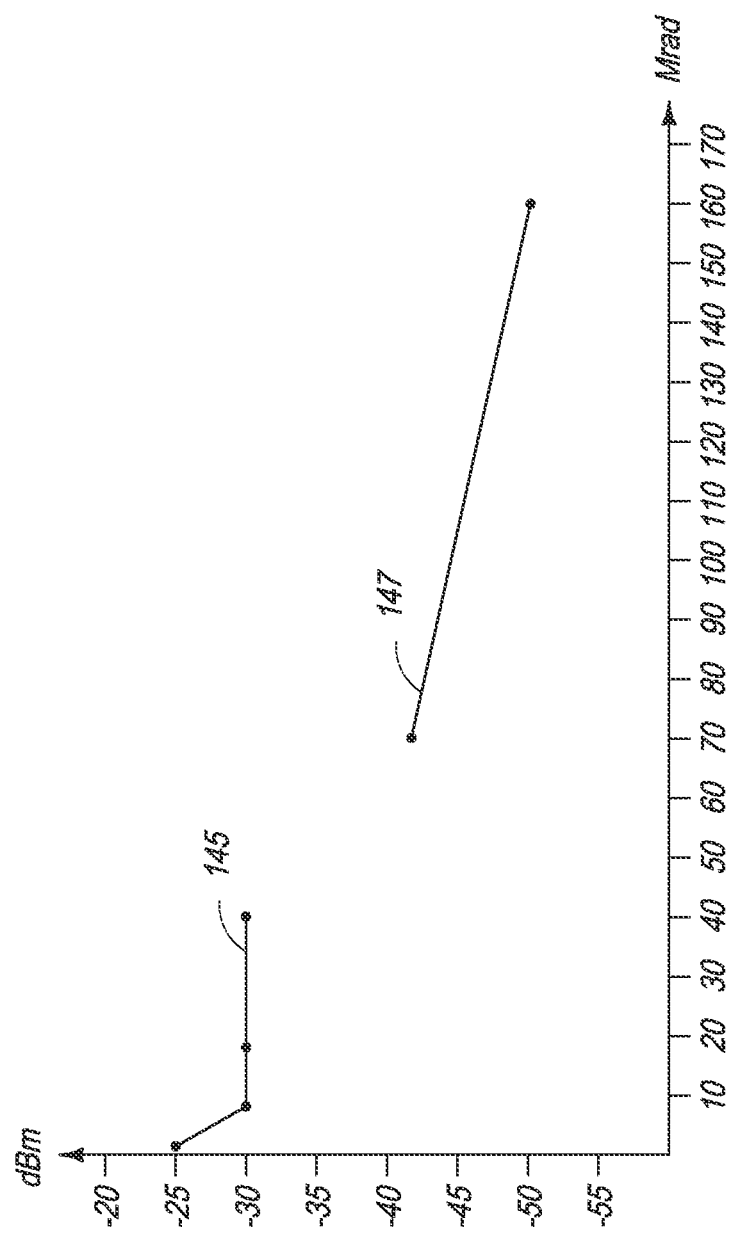
FIG. 4 is a graph having plots representing a magnitude of a third harmonic distortion signal from the ESD device of FIG. 2-3 in accordance with the present invention.

FIG. 4 is a graph having plots representing the magnitude of a third harmonic of a one gigahertz (1 GHz) signal that is generated by device 110 for various doses used to irradiate device 110. The abscissa indicates increasing dose in Mrad and the ordinate indicates increasing magnitude, in dBm, of the third harmonic of the signal to which device 110 is exposed. For this test, device 110 was placed in an RF signal path. The RF signal had a frequency of approximately one Giga-Hertz (1 GHz) and a transmitted power of ABOUT THIRTY SIX (36) dBM.

A plot 145 illustrates that as the irradiation dose increases, the magnitude of the third harmonic initially decreases but then reaches a level that remains substantially constant. At an irradiation dose near eight (8) Mrad, device 110 generates a third harmonic signal having a magnitude of approximately minus twenty-eight (−28) dBm. When the dose was doubled to approximately sixteen (16) Mrad, the magnitude remained substantially constant at approximately minus twenty-eight and one-half (−28.5) dBm. At even higher doses, such as at forty (40) Mrad, the magnitude was still substantially constant at a magnitude of approximately minus thirty and one-half (−30.5) dBm. Thirty Mrad is equal to 300 KGy. This level is much greater than one skilled in the art would expect to use to irradiate a semiconductor device. AS illustrated by plot 145, one skilled in the art would think that irradiation doses greater than about 8 Mrad would not have additional effects on the amplitude of the harmonics. In addition, the cost of performing the irradiation becomes more expensive as the dose is increased. Thus, one skilled in the art would not desire to use doses greater than about eight (8) Mrad.

Additionally, it is believed that prior irradiation of semiconductor devices was limited to limit a dose of about eight (8) Mrad because the leakage current became excessive, especially at high temperature, and that forward voltage and surge became poorer.

However, it has been found that if the dose is taken to extremely high levels, the magnitude of the third harmonic unexpectedly reduces and the value of the leakage current does not appreciably increase. This is an unexpected result. As illustrated by a plot 147, at a dose of approximately seventy (70) Mrad the magnitude of the third harmonic is reduced to approximately minus forty (−40) dBm. For a dose of one hundred sixty (160) Mrad, the magnitude of the third harmonic is reduced to approximately minus fifty (−50) dBm. Also, the dose can be in the range of approximately forty (40) Mrad, to one hundred sixth (160) Mrad or can be no less than approximately eighty (80) Mrad. Additionally, the protection from ESD events has not deteriorated and the ESD blocking voltage remained low. Therefore, it has been unexpectedly found that very high irradiation doses can assist in reducing the magnitude of the third harmonic of signals having a frequency greater than approximately nine hundred (900) MHz and particularly for frequencies no less than one (1) GHz. The method of forming device 110 provides a low cost semiconductor type of bi-directional ESD protection device that has a low capacitance and that minimizes the magnitude of distortions generated by device 110.

Those skilled in the art will appreciate that the method used to form device 110 may also be used to form other semiconductor type of ESD protection devices. Several examples of such ESD devices are described hereinafter.

Figure 5:
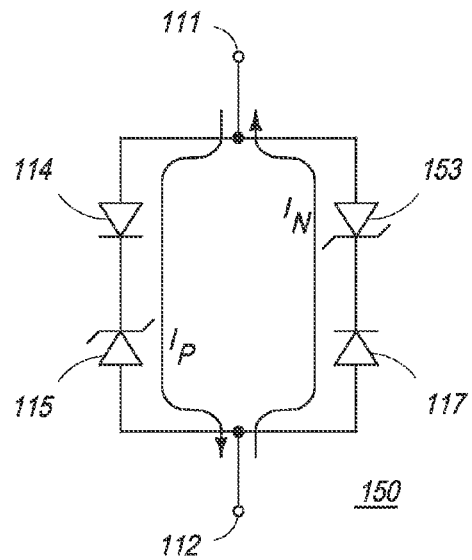
FIG. 5 schematically illustrates an embodiment of a portion of another ESD device that is an alternate embodiment of the ESD device of FIG. 2-3 in accordance with the present invention.

FIG. 5 schematically illustrates an embodiment of a portion of a circuit representation of an ESD device 150 that is an alternate embodiment of device 110 that was described in the description of FIG. 1-FIG. 4. The circuit schematic of device 150 is similar to the circuit schematic of device 110 except that device 150 includes an additional zener diode 153. Diode 153 has a cathode that is connected to the cathode of diode 117, and an anode that is connected to terminal 111. Under zero bias conditions, the equivalent capacitance of the first branch of device 150 that includes diodes 117 and 153 forms a low equivalent capacitance that is lower than the capacitance of either of diodes 117 or 153. Similarly, the second branch that includes diodes 114 and 115 forms a low equivalent capacitance as described hereinbefore. The overall capacitance of device 150 is the addition of the capacitance of the two parallel branches which provides low capacitance due to the small capacitance of each branch.

Figure 6:
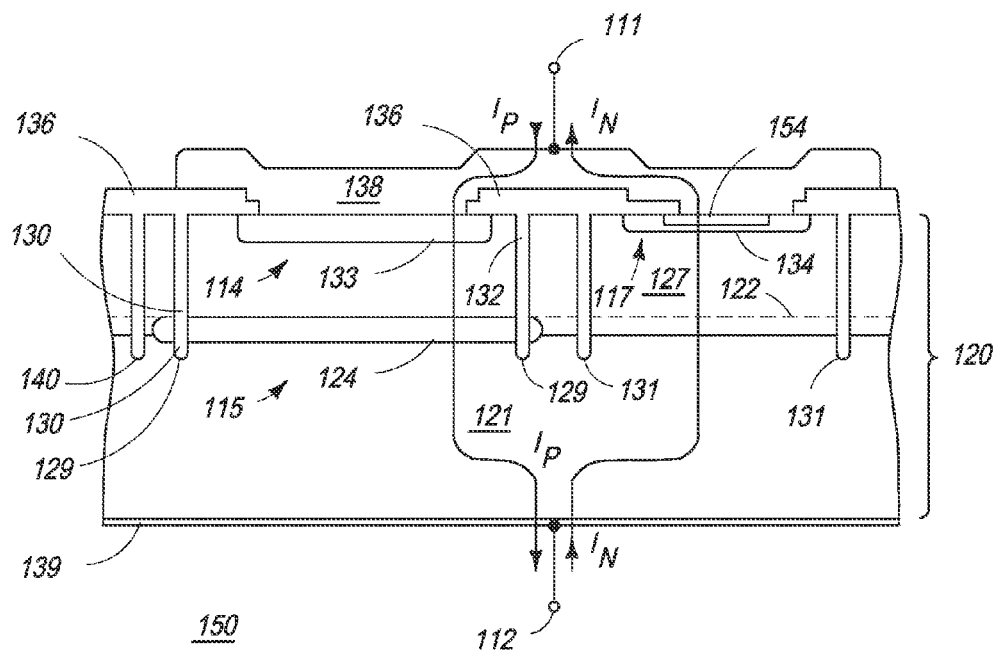
FIG. 6 illustrates a cross-sectional view of a portion of an embodiment of the ESD device of FIG. 5 in accordance with the present invention.

FIG. 6 illustrates a cross-sectional view of a portion of an embodiment of device 150. The cross-section of device 150 is similar to the cross-section of device 110 except that device 150 includes a doped region 154 that is formed within region 134. Region 154 has the conductivity type of substrate 121 and a doping concentration that is similar to the doping concentration of region 134 and preferably the doping concentration of substrate 121. The high doping concentration of regions 134 and 154 forms a sharp knee for diode 153 without affecting the capacitance of diode 117. Adding diode 153 in series with diode 117 provides device 150 bidirectional ESD protection and also configures device 150 with a substantially symmetrical clamping voltage for both the Ip and In current paths.

Although the doping concentrations given for regions 124 and 134 are those for the preferred embodiment of a five volt (5V) to fifty volt (50V) breakdown voltage for respective diodes 115 and 153, those skilled in the art will appreciate that the doping concentrations may have to change for other breakdown voltages. For example, for an eighty volt (80V) breakdown voltage, the doping concentration of regions 124 and 134 may be decreased, or the depth of regions 124 and 134 may be increased, or the doping concentration of substrate 121 may be decreased, or regions 124 and 134 along with substrate 121 may be decreased. Generally, the doping concentration of region 127 is at least one order of magnitude less than the doping concentration of region 124.

Device 150 as described hereinbefore relating to FIGS. 5 and 6, may be formed similarly to and may have a structure that is similar to an ESD device described in U.S. Pat. No. 7,538,399 which issued on May 26, 2009.

Device 150 is further formed by a method that includes irradiating at least a portion of device 150 similarly to that described for device 110. Therefore, one of the steps in the method of forming device 150 includes irradiating at least the portion of region 127 near structures 129 and 131.

Figure 7:
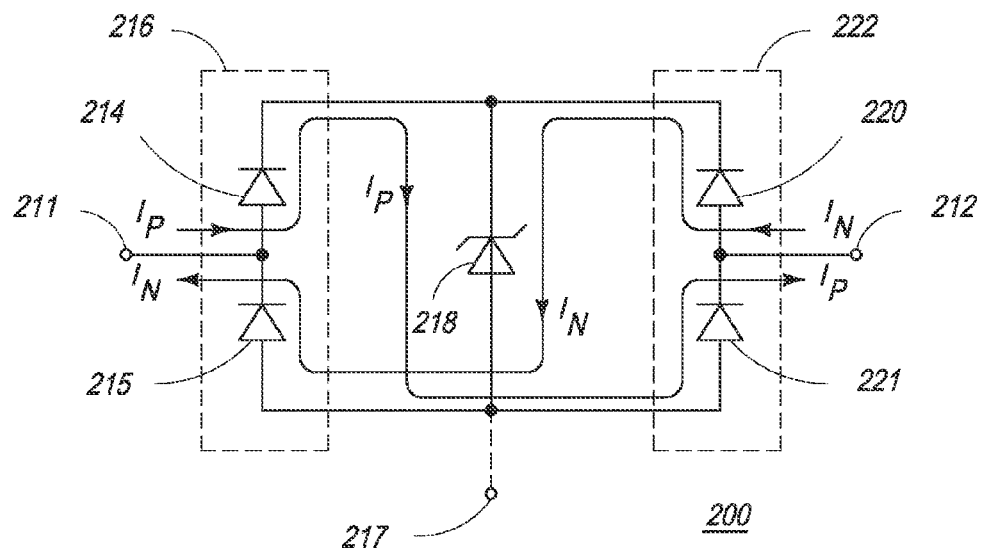
FIG. 7 schematically illustrates an embodiment of a portion of an ESD device that is another alternate embodiment of the ESD devices of FIGS. 2-3 and 5-6 in accordance with the present invention.

FIG. 7 schematically illustrates an embodiment of a portion of another bi-directional electrostatic discharge (ESD) protection device or ESD device 200 that is an alternate embodiment of devices 110 and 150. Device 200 includes two terminals, a first terminal 211 and a second terminal 212, and is configured to provide bidirectional ESD protection between terminals 211 and 212. Either of terminals 211 and 212 can be an input terminal or an output terminal. The output terminal usually is connected to another element that is to be protected by device 200, such as an element of system 10 (FIG. 1). Device 200 includes a plurality of steering diode channels that includes a first steering diode channel 216 and a second steering diode channel 222. Channel 216 includes a first steering diode 214 that has an anode commonly connected to terminal 211 and to a cathode of a second steering diode 215. Channel 222 includes a third steering diode 220 that has an anode commonly connected to terminal 212 and to a cathode of a fourth steering diode 221. Diodes 214, 215, 220, and 221 are formed as P-N junction diodes that have a low capacitance. A zener diode 218 is connected in parallel with each of channels 216 and 222. Diode 218 has an anode connected to the anode of diodes 215 and 221, and a cathode connected to the cathode of diodes 214 and 220.

One skilled in the art will appreciate that as a result of a positive ESD event at terminal 211, such as relative to terminal 212, a positive current Ip flows in series from diode 214 to diode 218. Additionally, for this current flow, diode 215 is in parallel with the combination of diodes 214 and 218.

Figure 8:
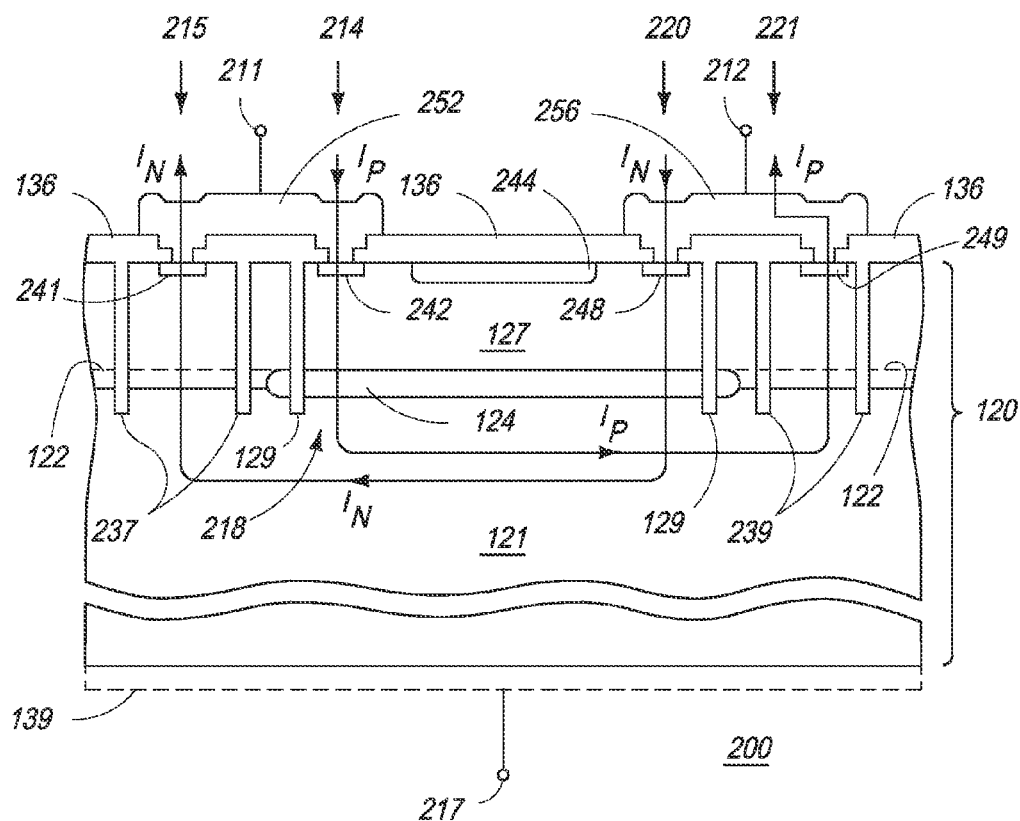
FIG. 8 illustrates a cross-sectional view of a portion of an embodiment of the ESD device of FIG. 7 in accordance with the present invention.

FIG. 8 illustrates a cross-sectional view of a portion of an embodiment of ESD device 200. Diodes 214, 215, 220, 221, and 218 are formed on semiconductor substrate 120. Diodes 214, 215, 220, 221, and 218 are identified in a general manner by arrows.

Blocking structures 129, 237, and 239 may be formed in order to isolate the portion of region 127 where diodes 214 and 220 are to be formed from the portion of region 127 where diodes 215 and 221 are to be formed. For this embodiment, blocking structure 129 usually extends through region 124 a distance into substrate 121 in order to prevent conduction laterally through region 124 between diode 218 and either of diodes 215 or 221. In one embodiment, both of diodes 214 and 220 are formed to overlie a portion of region 124. Structures 129, 237, and 239 also may minimize electrical coupling between the enclosed portions of device 200 and other portions of device 200. Structures 237 and 239 may be formed and provided with isolation in a manner similar to structure 129 and each similarly may be regarded as a multiply-connected domain.

Diode 214 includes a doped region 242 that is formed on the surface of region 127 with the same conductivity as substrate 121. Similarly, diode 220 includes a doped region 248 that is formed on the surface of region 127 with the same conductivity as substrate 121. Regions 242 and 248 may be formed to extend into region 127 and overlie region 124. Regions 242 and 248 usually are positioned to be within the periphery of the closed polygon form by structure 129, such as the periphery formed at the surface of region 127, thus, regions 242 and 248 are completely surrounded by the periphery of structure 129. Because structure 129 extends through region 127, it reduces the amount of region 127 that is near regions 242 and 248 thereby assisting in reducing the capacitance of diodes 214 and 220. The peak doping concentration of regions 242 and 248 generally is greater than the peak doping concentration of region 127 and preferably is approximately equal to the peak doping concentration of substrate 121. Regions 242 and 248 generally are formed to extend a distance no greater than about two (2) microns and preferably about one tenth to two (0.1-2) microns from the surface into region 127. The large differential doping concentration between region 242 and region 127 and also between region 248 and region 127 and the shallow depth of regions 242 and 248 assists in providing respective diodes 214 and 220 with a very small zero bias capacitance. This very small zero bias capacitance of diodes 214 and 220 assists in forming a small zero bias capacitance for device 200. The capacitance of each of diodes 214 and 220 at zero bias generally is less than about 0.4 picofarads and the equivalent series capacitance of diodes 214, 218, and 220 forms a capacitance for device 200 that is about 0.2 picofarads and preferably is no greater than about 0.01 picofarads.

A doped region 249 is formed in region 127 with the opposite conductivity to substrate 121 in order to form diode 221. Similarly, a doped region 241 is formed in region 127 with the opposite conductivity to substrate 121 in order to form diode 215. Regions 241 and 249 are formed on the surface of region 127 and preferably extend approximately the same distance into region 127 as regions 242 and 248. However, regions 241 and 249 do not overlie region 124. Regions 241 and 249 are positioned so that the periphery of regions 241 and 249, such as the periphery at the surface of region 127 and extending into region 127, is external to the closed polygon formed by structure 129. The periphery of region 241, such as the periphery at the surface of region 127 and extending into region 127, is formed to be completely surrounded by structure 237. Region 249 is positioned so that the periphery of region 249, such as the periphery at the surface of region 127, is completely surrounded by structure 239. Each of structures 237 and 239 preferably are formed as one continuous structure. Because structures 237 and 38 extend through region 127, they reduce the amount of region 127 that is near respective regions 241 and 249 thereby assisting in reducing the capacitance of respective diodes 2215 and 221. In the preferred embodiment, regions 241 and 249 have a peak doping concentration that is greater than the peak doping concentration of region 127 and preferably is approximately equal to the peak doping concentration of substrate 121.

Regions 242 and 248 generally are separated vertically from region 124 by a distance that assists in minimizing the capacitance of diodes 215 and 221. The spacing generally is approximately two to twenty (2-20) microns.

An optional doped region 244 may be formed in region 127 with the opposite conductivity to substrate 121. Region 244 usually is formed to overlie at least a portion of region 124 and usually is positioned between regions 242 and 248, thus, region 244 is within the multiply-connected domain formed by structure 129. Region 244 preferably extends approximately the same distance into region 127 as regions 242 and 248. Region 244 functions as a channel stop that assists in preventing the formation of an inversion channel near the surface of region 127 between diodes 214 and 220. Additionally, the high differential doping concentration between region 244 and region 127 assists in preventing the formation of a parasitic bipolar transistor between region 242, region 127, and region 248. In some embodiments where the differential doping concentration does not form such a parasitic bipolar transistors, region 244 may be omitted.

A conductor 252 may be formed to connect the anode of diode 114 to the cathode of diode 215. Another conductor 256 may be formed to connect the anode of diode 220 to the cathode of diode 221.

In one embodiment, device 200 is a symmetrical bi-directional ESD protection device when connected between terminals 211 and 212. Thus, the blocking voltage of device 200 is symmetrical in both directions. In one example, the blocking voltage may be in the range of about twenty to forty volts (20-40V) in order to protect cell phone antenna which operates in similar voltage range. The bi-directional and symmetrical nature is devised to enable capacitance to have low value and the value to be constant over a large voltage range between the positive and negative breakdown voltages, referred to as a linear characteristic.

In another embodiment, device 200 may also include a third terminal 217 (illustrated by dashed lines). Terminal 217 may be formed by forming conductor 139 (illustrated by dashed lines) on the bottom surface of substrate 121 and providing a connection from conductor 139 to terminal 217.

Device 200 as described hereinbefore relating to FIGS. 7 and 8, may be formed similarly to and may have a structure that is similar to an ESD device described in U.S. Pat. No. 7,579,632 which issued on Aug. 25, 2009 and which is hereby incorporated herein by reference.

Device 200 is further formed by a method that includes irradiating at least a portion of device 200 similarly to that described for device 110. Therefore, one of the steps in the method of forming device 200 includes irradiating at least the portion of region 127 near structures 129, 237, and 239. As a result, the distortions are minimized. Additionally, the capacitance value is reduced and the linear characteristic is improved.

Figure 9:
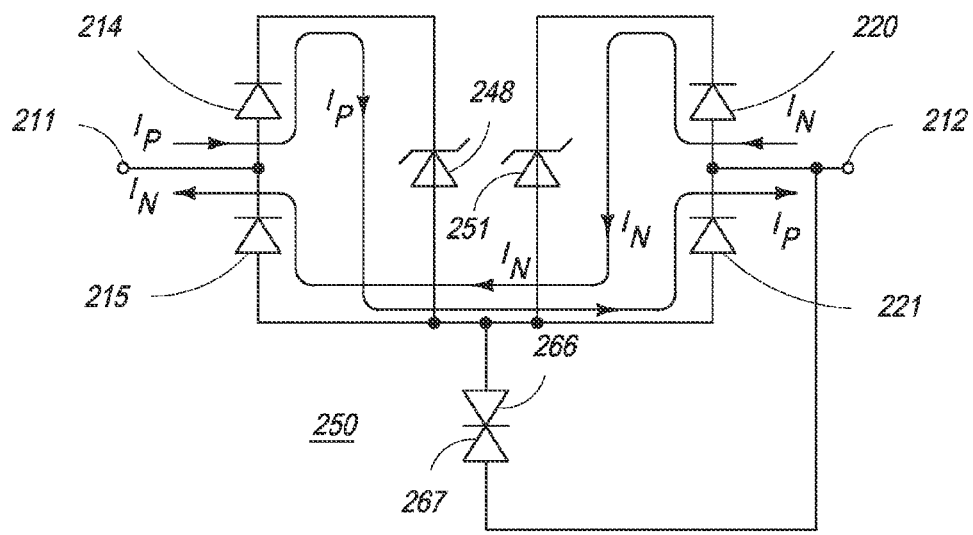
FIG. 9 schematically illustrates an embodiment of a portion of another ESD device that is an alternate embodiment of the ESD devices of FIGS. 2-3 and 5-8 in accordance with the present invention.

FIG. 9 schematically illustrates an embodiment of a portion of a bi-directional electrostatic discharge (ESD) protection device or ESD device 250 that is an alternate embodiment of devices 110, 150, and 200. The circuit of device 250 is similar to device 200 except that device 250 includes an additional zener diode 251 and a pair of back-to-back diodes, illustrated as diodes 266 and 267. The anode of diodes 218 and 251 are commonly connected to an anode of diode 266. A cathode of diode 266 is connected to a cathode of diode 267 which has an anode connected to terminal 212.

Figure 10:
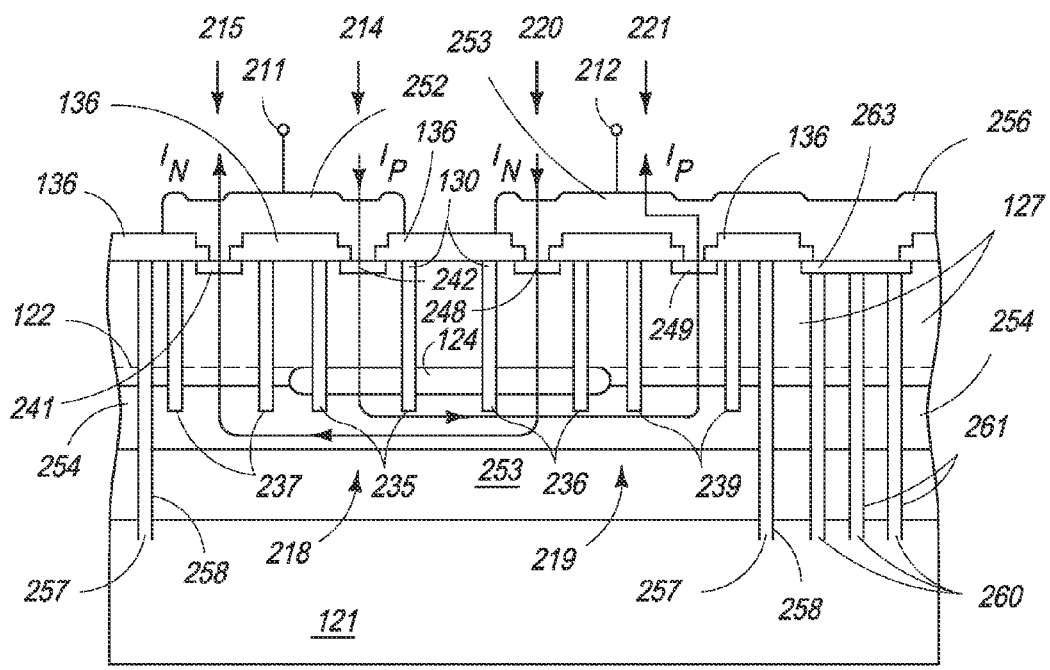
FIG. 10 illustrates a cross-sectional view of a portion of an embodiment of the ESD device of FIG. 9 in accordance with the present invention.

FIG. 10 illustrates a cross-sectional view of a portion of an embodiment of ESD device 250. Device 250 is formed similarly to device 200 except that device 250 includes an additional semiconductor layer 253 formed to overlie substrate 121 and another semiconductor layer 254 that is formed between layer 253 and region 127. In the preferred embodiment, layer 254 is formed on a surface of substrate 121 as an N-type semiconductor material, such as formed as an epitaxial layer. In the preferred embodiment, layer 254 is formed on the surface of layer 253 as P-type semiconductor material, such as formed as an epitaxial layer. Region 124 is formed on layer 254. Diode 267 is formed by the interface of substrate 121 and layer 253, and diode 266 is formed by the interface between layers 253 and 254.

Device 250 usually includes additional blocking structures 238 and 236 that are formed in a manner similar to structures 129, 237, and 239. Structure 129 typically is omitted. Structures 235 and 236 are formed as multiply-connected domains which surround the periphery of respective regions 242 and 248. Structures 235 and 236 extend from the surface of region 127 through region 124 and into layer 254. Structures 235 and 236 separate region 127 into separate regions that will form separate P-N junctions between region 124 and region 127 thereby using region 124 to form two zener diodes 218 and 251.

Device 250 also may be formed to include another blocking structure 257 along with conductor trenches or conductors 260 and a doped region 263. Doped region 263 is usually formed on the surface of region 127. Conductors 260 usually are formed to extend though region 263, through region 127 and layers 253 and 254 into substrate 121 so that conductors 260 form an electrical connection between substrate 121 and region 263. Structure 257 isolates diodes 214, 215, 218, 220, 221, and 251 from conductors 260 and from region 263. This prevents lateral current flow from any of these diodes to conductors 260 (or to region 263) through any of layers 253 and 254 and region 127. Structure 257 is used to prevents currents Ip and $I_N$ from flowing laterally through layer 254 past the diodes where the currents are intended to flow through. Conductors 260 facilitate forming an electrical connection from the top surface of region 127 to substrate 121. Conductor 256 usually is extended to make contact to region 263 thereby forming an electrical connection between the anode of diodes 218 and 251 to the anode of diode 266.

Device 250 as described hereinbefore relating to FIGS. 9 and 10, may be formed similarly to and may have a structure that is similar to an ESD device described in United States patent publication no. 2010/0090306 which was published on Apr. 15, 2010 and which is hereby incorporated herein by reference.

Device 250 is further formed by a method that includes irradiating at least a portion of device 250 similarly to that described for device 110. Therefore, one of the steps in the method of forming device 250 includes irradiating at least the portion of region 127 near structures 235, 236, 237, and 239.

From all the foregoing one skilled in the art can determinate that according to one embodiment, a bi-directional ESD device comprises: a semiconductor substrate, such as a substrate 120; a zener diode formed on the semiconductor substrate; a first P-N diode, such as a diode 114 or 214, formed on the semiconductor substrate, the first P-N diode coupled to conduct current in series with the zener diode; a first blocking structure, such as structure 129, that extends into the semiconductor substrate and forms a first closed polygon having a periphery wherein the first P-N diode and at least a portion of the zener diode are within the closed polygon; and a second P-N diode, such as a diode 115 or 215, formed on the semiconductor substrate, the second P-N diode coupled in parallel with series combination of the zener diode and the first P-N diode, the bi-directional ESD device having a third harmonic of fundamental frequencies no less than eight hundred MHz wherein the third harmonic has a magnitude that is no greater than about minus thirty five (−35) dBm.

In another embodiment, an amount of excess carriers is reduced by irradiating the bi-directional ESD device structure with an irradiation dose no less than approximately 70 Mrad.

In yet another embodiment, the method includes irradiating the bi-directional ESD device with one of particle bombardment, an electron beam, a proton beam, a neutron beam, or gamma particles prior to assembling the bi-directional diode structure into a semiconductor package.

According to another embodiment, a method of forming a bi-directional ESD device comprises: providing a bi-directional ESD device, for example one of devices 110, 150, 200, or 250, formed on a semiconductor substrate, substrate 120 for example, and having at least one zener diode, one P-N diode, and one blocking structure wherein the blocking structure has a periphery that forms a multiply-connected domain with at least a portion of a periphery of the P-N diode within the multiply-connected domain; and irradiating the bi-directional ESD device with an irradiation dose no less than approximately 70 Mrad.

An alternate embodiment of the method may include forming a first semiconductor region, such as region 127, overlying a semiconductor substrate, for example substrate 121, of a first conductivity type and a first doping concentration wherein the first semiconductor region has a second conductivity type and has a second doping concentration; forming the blocking structure surrounding a first portion of the first semiconductor region; and forming a first doped region, for example one of regions 133, 242, or 248, of the first conductivity type within the first portion of the first semiconductor region.

Another embodiment of a method of forming a bi-directional ESD device can comprise: providing a semiconductor substrate, substrate 121 for example, of a first conductivity type and a first doping concentration and having a surface; forming a semiconductor region, such as region 127, overlying at least a portion of the semiconductor substrate wherein the semiconductor region has a second conductivity type and a second doping concentration that is less than the first doping concentration; forming a first diode within the semiconductor region; forming a first blocking structure that extends through the semiconductor region and forms a first closed polygon having a periphery that surrounds the first diode and at least a portion of the semiconductor region; and forming a third harmonic of fundamental frequencies of the bi-directional ESD device to have a magnitude that is no greater than about minus thirty five (−35) dBm at frequencies no less than approximately eight hundred (800) MHz.

Another method embodiment may include irradiating at least a portion of the semiconductor region proximate to the first blocking structure with an irradiation dose no less than approximately 150 Mrad.

Yet another method may also include forming a zener diode that is within the closed polygon of the first blocking structure.

In view of all of the above, it is evident that a novel device and method is disclosed. Included, among other features, is forming a bi-directional ESD device on a semiconductor substrate and forming the bi-directional ESD device to have a third harmonic at frequencies no less than one gigahertz wherein the third harmonic has a magnitude that is no greater than about minus thirty five (−35) dBm. The semiconductor type ESD device formed on a semiconductor substrate as one integrated circuit has a lower cost than other ESD protection devices. The bi-directional ESD device may also be formed to have a low capacitance which increases the number of applications where the semiconductor type bi-directional ESD device may be used.

While the subject matter of the descriptions are explained with specific preferred embodiments and example embodiments, the foregoing drawings and descriptions thereof depict only typical and exemplary embodiments of the subject matter and are not therefore to be considered to be limiting of its scope, it is evident that many alternatives and variations will be apparent to those skilled in the art. As will be appreciated by those skilled in the art, the exemplary form of system 10 is used as a vehicle to explain one application for an integrated bi-directional ESD protection device. Although the doping concentrations are given for certain embodiments, those skilled in the art will appreciate that the doping concentrations may be changed as long as the explained relative doping levels are preserved. Those skilled in the art will appreciate that the bi-directional ESD device, such as devices 110, 150, 200, and 250, may be used in various other applications that need ESD protection. Devices 110, 150, 200, and 250 are also used a vehicles to explain the method that facilitates forming the ESD device to have a third harmonic of fundamental frequencies wherein the third harmonic is no less than one gigahertz wherein a magnitude of the third harmonic has a low amplitude, such as an amplitude that is no greater than about minus thirty five (−35) dBm. Those skilled in the art will appreciate that the method is also applicable to other bi-directional ESD protection devices that are formed on a semiconductor substrate, such as formed as one integrated circuit. Although structures 129 and 131 and the like are described as trench structures, one skilled in the art will appreciate that they may also be formed by a junction isolation region, or dielectric regions. Additionally, the word "connected" is used throughout for clarity of the description, however, it is intended to be interpreted as including either a direct connection or an indirect connection.

As the claims hereinafter reflect, inventive aspects may lie in less than all features of a single foregoing disclosed embodiment. Thus, the hereinafter expressed claims are hereby expressly incorporated into this Detailed Description of the Drawings, with each claim standing on its own as a separate embodiment of an invention. Furthermore, while some embodiments described herein include some but not other features included in other embodiments, combinations of features of different embodiments are meant to be within the scope of the invention, and form different embodiments, as would be understood by those skilled in the art.

The invention claimed is:

1. A bi-directional electro-static discharge device comprising:
   a semiconductor substrate;
   a zener diode formed on the semiconductor substrate;
   a first P-N diode formed on the semiconductor substrate, the first P-N diode coupled to conduct current in series with the zener diode;
   a first blocking structure that extends into the semiconductor substrate and forms a first closed polygon having a periphery wherein the first P-N diode and at least a portion of the zener diode are within the first closed polygon; and
   a second P-N diode formed on the semiconductor substrate, the second P-N diode coupled in parallel with series combination of the zener diode and the first P-N diode, the bi-directional electro-static discharge device having a third harmonic at fundamental frequencies no less than one gigahertz wherein the third harmonic has a magnitude that is no greater than about minus thirty five dBm.

2. The bi-directional electro-static discharge device of claim 1 wherein an amount of energy required to cause carriers that are adjacent to the first blocking structure to accumulate at the interfaces is increased, or the number of electrically active carriers is decreased, or the lifetime of the excess carriers is reduced by irradiating the bi-directional electro-static discharge device with an irradiation dose no less than approximately 70 Mrad.

3. The bi-directional electro-static discharge device of claim 2 wherein irradiating the bi-directional electro-static discharge device includes irradiating the bi-directional electro-static discharge device with one of particle bombardment, an electron, beam, a proton beam, a neutron beam, or gamma particles prior to assembling the bi-directional diode structure into a semiconductor package.

4. The bi-directional electro-static discharge device of claim 1 wherein the bi-directional electro-static discharge device further includes:
   a doped semiconductor material having a first conductivity type, a first peak doping concentration, and a first surface;
   a first semiconductor region of a second conductivity type abutting the first surface of the doped semiconductor material, the first semiconductor region forming the zener diode with, dopants of the doped, semiconductor material;
   a second semiconductor region of the second conductivity type on the first semiconductor region;
   a first doped region of the first conductivity type positioned in the second semiconductor region and overlying at least a portion of the first semiconductor region; and
   the first blocking structure extending from a top surface of the second semiconductor region, into the first semiconductor region wherein an outside perimeter of the first doped region is within the first closed polygon of the first blocking structure.

5. The bi-directional electro-static discharge device of claim 4 wherein the first closed polygon also surrounds a first portion of the first semiconductor region and a first portion of the second semiconductor region.

6. The bi-directional electro-static discharge device of claim 5 further including a second blocking structure formed as a second closed polygon having a periphery that surrounds the second P-N diode and a second portion of the first semiconductor region.

7. The bi-directional electro-static discharge device of claim 4 wherein the second semiconductor region has a doping concentration that is at least one order of magnitude less than, a doping concentration of the first semiconductor region.

8. The bi-directional electro-static discharge device of claim 1 further including,
   a bulk semiconductor substrate of a first conductivity type having a first doping concentration and having a surface;
   forming a first semiconductor region overlying at least a portion of the bulk semiconductor substrate wherein the first semiconductor region has a second conductivity type and a second doping concentration that is less than the first doping concentration; and
   forming the first P-N diode within the first semiconductor region.

9. The bi-directional electro-static discharge device of claim 1 including:
   a first terminal of the bi-directional electro-static discharge device;
   a second terminal of the bi-directional electro-static discharge device;
   the zener diode having an anode coupled to the second terminal of the electro-static discharge device and also having a cathode;
   the first P-N diode having an anode coupled to the first terminal and having a cathode; and
   the second P-N diode having an anode that is coupled to the anode of the zener diode and to the second terminal, the second P-N diode having a cathode coupled to the cathode of the first P-N diode.

10. A method of forming a bi-directional electro-static discharge device comprising:
    providing a bi-directional electro-static discharge device formed on a semiconductor substrate and having at least a zener diode, a P-N diode, and a blocking structure wherein the blocking structure has a periphery that forms a multiply-connected domain with at least a portion of a periphery of the P-N diode within the multiply-connected domain; and
    irradiating the bi-directional electro-static discharge device with an irradiation dose no less than approximately 40 Mrad.

11. The method of claim 10 wherein providing the bi-directional electro-static discharge device includes forming a first semiconductor region overlying a semiconductor substrate of a first conductivity type and a first doping concentration wherein the first semiconductor region has a second conductivity type and has a second doping concentration;
    forming the blocking structure surrounding a first portion of the first semiconductor region; and
    forming a first doped region of the first conductivity type within the first portion of the first semiconductor region.

12. The method of claim 11 wherein forming the first semiconductor region includes forming a peak doping concentration of the first semiconductor region to be less than a peak doping concentration of the semiconductor substrate.

13. The method of claim 11 wherein irradiating the bi-directional electro-static discharge device with an irradiation dose no less than approximately 40 Mrad includes increasing an amount of energy required to cause carriers that are adjacent to the blocking structure to accumulate at the interfaces is increased, or the number of electrically active carriers is decreased, or the lifetime of the excess carriers is reduced.

14. The method of claim 10 wherein irradiating the bi-directional electro-static discharge device includes irradiating the bi-directional electro-static discharge device with one of particle bombardment, an electron beam, a proton beam, a neutron beam, or gamma particles subsequent to assembling the bi-directional diode into a semiconductor package.

15. The method of claim 10 wherein irradiating the bi-directional electro-static discharge device includes irradiating at least a portion of semiconductor material that is proximate to the blocking structure with, an irradiation dose no less than approximately 80 Mrad.

16. The method of claim 10 wherein irradiating the bi-directional electro-static discharge device includes irradiating at least a portion of semiconductor material that is proximate to the blocking structure with an irradiation dose of approximately 70 Mrad to 160 Mrad.

17. A method of forming a bi-directional electro-static discharge device comprising:
    providing a semiconductor substrate of a first conductivity type and a first doping concentration and having a surface;
    forming a semiconductor region overlying at least a portion of the semiconductor substrate wherein the semiconductor region has a second conductivity type and a second doping concentration that is less than the first doping concentration;
    forming a first diode within the semiconductor region;
    forming a first blocking structure that extends through the semiconductor region and forms a first closed polygon having a periphery that surrounds the first diode and at least a portion of the semiconductor region; and
    forming a third harmonic of fundamental frequencies of the bi-directional electro-static discharge device to have a magnitude that is no greater than about minus thirty five dbm at frequencies no less than approximately eight hundred megahertz (800 MHz).

18. The method of claim 17 wherein forming the third harmonic includes irradiating at least a portion of the semiconductor region proximate to the first blocking structure with an irradiation dose no less than approximately 150 Mrad.

19. The method of claim 17 further including forming a zener diode that is within the first closed polygon of the first blocking structure.

20. The method of claim 17 further including forming a second diode in the semiconductor region and spaced a first distance from the first diode and external to the first blocking structure wherein forming the first diode and forming the second diode includes forming a first doped region within the semiconductor region and having the first conductivity type and a doping concentration that is greater than a doping concentration of the semiconductor region, and forming a second doped region within the semiconductor region and having the first conductivity type and a doping concentration that is greater than the doping concentration of the semiconductor region.

21. The method of claim 17 wherein forming the third harmonic to have the magnitude that is no greater than about minus thirty five dBm at frequencies no less than, approximately one gigahertz includes forming the third harmonic to have the magnitude that is no greater than about minus thirty five dBm at received RF energies of 10 dBm to 40 dBm.

* * * * *